May 19, 1953 J. B. CARAWAY 2,639,328

BALANCED TO UNBALANCED ENERGY TRANSFER CIRCUIT

Filed June 23, 1945

*INVENTOR.*
JOHN B. CARAWAY
*BY* William D. Hall
*ATTORNEY*

Patented May 19, 1953 2,639,328

UNITED STATES PATENT OFFICE 2,639,328

BALANCED TO UNBALANCED ENERGY TRANSFER CIRCUIT

John B. Caraway, Evansville, Ind., assignor to the United States of America as represented by the Secretary of War Application June 23, 1945, Serial No. 601,117

10 Claims. (Cl. 178—44)

The present invention relates to circuits for efficiently transferring electrical energy between a source or load symmetrical with respect to ground and a load or source asymmetrical with respect to ground.

More specifically it relates to means by which high radio frequency energy, produced in a push-pull amplifier or oscillator, which is balanced with respect to ground can be transformed into an unbalanced state and can then be conducted efficiently through an unbalanced concentric line, the outer conductor of which has a relatively low or zero impedance to ground.

Push-pull oscillators and amplifiers are widely used as radio frequency energy sources. They employ matched power vacuum tubes and matched circuit elements in order to deliver accurately balanced output. Their output terminals are at adequate radio frequency impedance to ground to float as to radio frequencies and to be free to oscillate above and below ground potential as driven by the oscillator or amplifier. In properly designed circuits these impedances are as closely identical as is practically possible and the output potentials on each terminal are, at any instant equal in voltage and opposite in polarity, that is, 180° out of phase. Such terminals cannot be connected directly to unbalanced loads without the interposition of some device for translating the output energy in a balanced form into unbalanced form.

The impedance that an oscillator or amplifier would see looking directly into a concentric line would be unbalanced. It would be unbalanced even if the outer conductor were insulated from ground because the inner and outer conductors have unequal physical dimensions, are located differently with respect to ground, and because of the shielding effect of the outer conductor. The unbalance of such a line is maximum when the entire outer conductor is grounded which is the manner of normal use.

A problem, therefore, exists in feeding the output of a balanced power source into a concentric line or other unbalanced load. At relatively low radio frequencies this problem can be met by the use of conventional transformers but at high radio frequencies their use is not practical.

An object of this invention is to provide an arrangement of concentric and parallel transmission line sections to achieve this translation with a favorable transformation ratio and an efficient balanced to unbalanced junction. A circuit embodying the principles of this invention is advantageous in particular at very high frequencies the corresponding wavelengths of which are so short that they approach the physical dimensions of the circuit.

The present circuit retains all the advantages of substantial balance in the elements of the balanced circuit such as avoiding overload on one or more power tubes, avoiding excessive standing wave ratios, avoiding excessive radiation losses, avoiding distortion and spurious harmonics. It also has the advantage of aiding in maximum power transfer.

Other objects, features, and advantages of this invention will suggest themselves to those skilled in the art and will become apparent from the following description of the invention taken in connection with the accompanying drawings in which.

Figure 1:
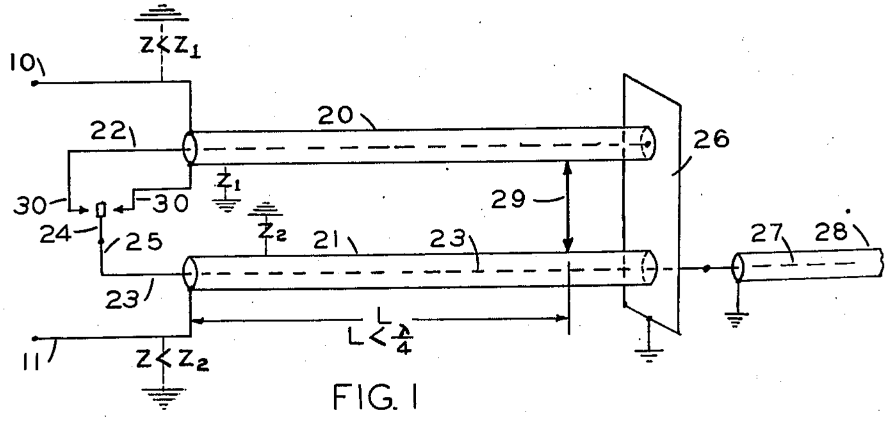
Fig. 1 is a schematic circuit diagram of a circuit embodying the invention which includes a means of adjustment for operating frequency and transformation ratio.

Referring to Fig. 1, 10 and 11 represent output terminals of any balanced source of radio frequency energy such as a push-pull oscillator or amplifier. These terminals are connected to low voltage, high current points in the output circuit of the source which are at equal impedances to ground and are protected from any direct current component. Symmetrical parallel tubular conductors 20 and 21 are connected to terminals 10 and 11, respectively, and each is designed to have an effective electrical length, L, less than one-quarter of the wavelength corresponding to the operating frequency. Tubular conductors 20 and 21 are the outer conductors of two concentric lines.

Inner conductors 22 and 23 of the two concentric lines are respectively disposed concentrically within outer conductors 20 and 21. Single pole, double throw switch 24 connected to inner conductor 23 by conductor 25, permits a choice between connecting inner conductor 23 either to the other inner conductor 22 or to the outer conductor 20 of the other concentric line. Outer conductors 20 and 21 terminate in a grounded shorting plate 26 which is of material having high electrical conductivity.

A concentric load line consisting of inner conductor 27 and outer conductor 28 is connected to the balanced source through this arrangement by directly joining inner conductors 23 and 27 and by joining outer conductors 21 and 28 either directly or through a common connection to ground. A shorting bar 29 is movable and is disposed to contact the conductors 20 and 21 along substantially their entire length. When bar 29 is moved to the left, that is, away from the plate 26, the electrical length of conductors 20 and 21 are reduced just as though shorting plate 26 were itself moved to the new position of 29 and the surplus portions of outer conductors 20 and 21 were completely removed from the circuit. Movable shorting bar 29 permits adjustment for the use of different frequencies and to obtain different transformation ratios.

Figure 2:
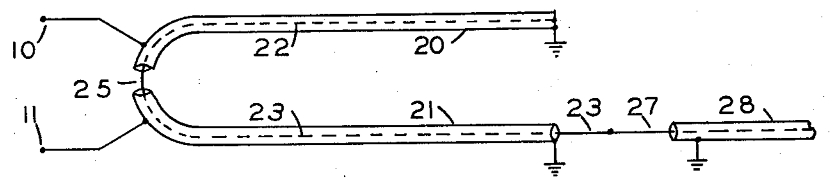
Fig. 2 is a schematic drawing of one modification offering a compact form of construction.

In the embodiment shown in Fig. 2 the length of the parallel concentric transmission lines 20, 22 and 21, 23 are fixed for a fixed band of operating frequencies and a corresponding fixed range of transformation ratios. In order to reduce space and to reduce the length of the connecting conductor 25, the ungrounded ends of parallel transmission lines 20, 22 and 21, 23 are curved toward each other. No switch is employed and the connection between inner conductors 22 and 23 by conductor 25 is permanent. The proximity of the ungrounded ends of outer conductors 20 and 21 forms a capacity loading at that end of these conductors.

Figure 3:
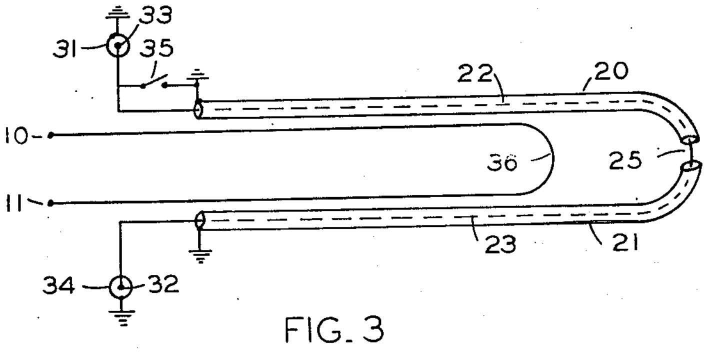
Fig. 3 is a schematic drawing of a second modification with adjustable means for coupling the circuit to its power source and means for switching from balanced to unbalanced operation to balanced to balanced operation.

The embodiment shown in Fig. 3 includes means for adjusting the coupling between the balanced output 10 and 11 and the transforming device of the present invention. In this embodiment, instead of connecting terminals 10 and 11 directly to outer coductors 20 and 21, as in Fig. 2, a coupling loop 36 is connected to those terminals. Coupling loop 36 is movable with respect to outer conductors 20 and 21 and inner conductors 22 and 23, thereby permitting variation in the coupling.

This embodiment also includes means so that the circuits can operate to match impedances properly when a balanced load is fed by a balanced output. These means comprise switch 35. When switch 35 is in its open position, as shown in Fig. 3, the circuits are arranged for balanced to balanced operation. Instead of inner conductor 22 being connected to ground, as is the case when switch 35 is closed for feeding an unbalanced load, inner conductor 22 is connected to one side 33 of a balanced load and the other inner conductor 23 is connected to the other side 32 of the balanced load. Thus switch 35 is valuable to adapt the apparatus to different types of loads that may be encountered in practice.

The principle of operation of the circuit herein described may be understood by a reference to Fig. 1. These circuits, as will now be shown, are in effect transmission line transformers. The primary path may be traced from terminal 10, through outer conductor 20, shorting bar 29 and outer conductor 21, to terminal 11. This forms a shorted parallel section, the shorted end of which is connected to ground. Since shorting bar 29 is always adjusted so that the length L of each outer conductor is less than a quarter of the wavelength corresponding to the operating frequency, the reactance presented by those conductors to terminals 10 and 11 is always inductive. It is essential that L be of sufficient length so that, without a load connected, the reactance presented by these conductors to terminals 10 and 11 be of a high value. When a load is connected, although the loading effect will decrease that impedance, between terminals 10 and 11, the impedances Z between either terminal 10 or 11 and ground will not be appreciably affected because the impedances $Z_1$ and $Z_2$ between the ends of respective outer conductors 20 and 21 to ground remain high, many times the value of the impedances between terminals 10 and 11 and ground.

When switch 24 is in the right hand position the secondary loop may be traced from inner conductor 27, through inner conductor 23, connections 25, 24, 30 (right) outer conductor 20, shorting bar 29, the portion of outer conductor 21 between shorting bar 29 and shorting plate 26 to the other side of the load, that is, ground or outer conductor 28. When switch 24 is in the left hand position the loop is completed through inner conductor 22, shorting plate 26 to the grounded side of the load instead of through 20, 29 and 21.

Either of these secondary loops is very tightly coupled to the primary loop because for practically the entire length of both primary and secondary loops, they are either concentric or have a common path and thus enclose the same field of flux.

From the foregoing analysis it may be seen that this device, in effect, is a variation of a conventional transformer and accomplishes the inherent advantages of such a device in keeping the secondary circuit from affecting the balance of the power source. The circuit herein described also provides for adjustment of the transformation ratio to match impedances for maximum power transfer. Adjustment of shorting bar 29 changes the sizes of the primary and secondary loops to an unequal extent because whatever the position of shorting bar 29, the length of inner conductor 23 in the circuit is unchanged and the same is true with respect to inner conductor 22 when switch 24 is in the left hand position. In principle this is equivalent to changing the turns ratio of a conventional transformer.

Moving shorting bar 29 away from shorting plate 26 reduces the coupling between primary and secondary loops because it varies the proportion of their total lengths which enclose the same field of flux. By these changes in coupling the impedance seen looking into the primary may be altered.

Switch 24 extends the range of changes in coupling and thus extends the range of impedance matching because it provides a means for giving a different effect quantitatively to the adjustment of shorting bar 29. The balanced to unbalanced function may be preserved for small changes in operating frequency without changing the length L of the outer conductors. A great change in frequency, however, will necessitate moving shorting bar 29 to a new position to preserve for the new frequency the inductive character of the input loop and the relative high impedance to ground of its open ends before they are connected to terminals 10 and 11.

In general principle the embodiment shown in Fig. 2 operates the same as that just explained with reference to Fig. 1. As pointed out above, this physical arrangement has the advantage of being more compact. Further, the degree of coupling is increased over that of the embodiment of Fig. 1 since, the portion of the loops which do not enclose the same field is decreased by shortening the connection 25 and the series self-impedance is decreased.

This embodiment, while lacking some of the adjustable features of that shown in Fig. 1 is of great value for operation over a predetermined band of frequencies.

The principle of operation of the embodiment shown in Fig. 3 for the closed position of switch 35 is essentially the same as that of the embodiment shown in Fig. 1 with the exception that power, instead of being fed into the primary loop by direct connection from the power source, is coupled in inductively through loop 36. Since loop 36 can be moved physically with relation to outer conductors 20 and 21, which may be considered as forming a second loop, impedance matching adjustments made necessary by changes in the load or in operating frequency can be made. No adjustment is necessary if it is desired that the circuits function merely to translate balanced output to an unbalanced load even over a wide range of frequencies.

The loop formed by outer conductors 20 and 21 includes a capacitive path existing across the closely spaced open ends.

When switch 35 is open, that end of the output loop consisting of inner conductor 22 is connected to contact 33 representing one side of a balanced load symmetrical with contact 32 representing the other side of the load instead of being connected, as in the other arrangements herein described, to the grounded side of an unbalanced load line. In this way switch 35 provides a means whereby either unbalanced or balanced output may be taken from the output loop.

The circuits of the present invention may also be used to transfer energy from an unbalanced source to a balanced load by introducing the energy at the unbalanced end and utilizing it in a balanced load at the other end. For this case the circuits operate in accordance with the same principles that have been discussed but the energy transfer will be in a reverse direction and those loops referred to as primaries will now act as secondaries and vice versa.

While there has been here described what is at present considered to be the preferred embodiment of the invention, it will be obvious to those skilled in the art that various changes and modifications may be made therein without departing from the scope of the invention.

What is claimed is:

1. Circuits for transforming electrical energy at radio frequencies between circuit balanced with respect to ground and a transmission line unbalanced and having one side connected to ground, comprising first and second substantially parallel transmission lines each having an inner conductor and an outer conductor, each of said lines having an electrical length less than one-quarter wavelength of the operating frequency, said first inner conductor and said outer conductors being at one end electrically connected to ground, the other ends of said outer conductors being connected to terminals of the balanced circuit, the impedance from said terminals to ground being low with respect to the impedance of said other ends of said parallel lines to ground, the end of the first inner conductor not connected to ground being connected to the corresponding end of the second inner conductor and the other end of said second inner conductor being connected to the non-grounded side of the unbalanced transmission line whereby any reflection of unbalance from said unbalanced transmission line to said balanced circuit is prevented.

2. Electrical apparatus for transferring electrical energy at radio frequencies between first and second circuits, comprising: a pair of coaxial transmission line sections spaced substantially in parallel relationship with one another; means for short circuiting one of said sections at one end thereof; a third circuit including the outer conductors of said sections, and means for coupling said outer conductors to said first circuit; a fourth circuit including the inner conductor of the other of said sections connected at one end thereof to said second circuit, at least a portion of one of the conductors of said one section, and means connecting the other end of said last-named inner conductor to said portion of said one section; and means for shorting said outer conductors to ground at a distance from their other ends corresponding to less than one-quarter of a wavelength of the operating radio frequency, said outer conductors having an impedance with respect to ground that is high in comparison with the impedance to ground of said first circuit.

3. The apparatus of claim 2, wherein said means for coupling said outer conductors to said first circuit comprises a loop disposed between said parallel sections.

4. The apparatus of claim 2, wherein the other ends of said pair of sections are curved toward one another.

5. Electrical apparatus for transferring electrical energy at radio frequencies between two circuits respectively balanced and unbalanced with respect to ground, comprising: a pair of coaxial transmission line sections spaced substantially in parallel relationship with one another, one of said sections being shorted at one end thereof; a first circuit including the outer conductors of said sections, and means for coupling said outer conductors to said balanced circuit; a second circuit including the inner conductor of the other of said sections connected at one end thereof to said unbalanced circuit, at least a portion of one of the conductors of said one section, and means connecting the other end of said last-named inner conductor to said portion of said one section; and means for shorting said outer conductors to ground at a distance from their other ends corresponding to less than one-quarter of a wavelength of the operating frequency, said outer conductors having an impedance with respect to ground that is high in comparison with the impedance to ground of said balanced circuit.

6. The apparatus of claim 5, wherein said portion of said one section includes at least a portion of said outer conductor of said one section.

7. The apparatus of claim 5, wherein said portion of said one section comprises the inner conductor of said one section.

8. The apparatus of claim 7, wherein the other ends of said pair of sections are curved toward one another.

9. Electrical apparatus for transferring electrical energy at radio frequencies between two circuits respectively balanced and unbalanced with respect to ground, comprising: a pair of coaxial transmission line sections spaced substantially in parallel relationship with one another, one of said sections being shorted at one end thereof; a first circuit including the outer conductors of said sections, and means for coupling said outer conductors to said balanced circuit; a second circuit including the inner conductor of the other of said sections connected at one end thereof to said unbalanced circuit, switch means for selectively connecting the other end of said last-named inner conductor to the other end of either of said inner or outer conductors of said one section, and at least a portion of the conductor of said one section that is selectively connected by said switch means; and means for shorting said outer conductors to ground at a distance from their other ends corresponding to less than one-quarter of a wavelength of the operating frequency, said outer conductors having an impedance with respect to ground that is high in comparison with the impedance to ground of said balanced circuit.

10. The apparatus of claim 9, wherein said means for shorting said outer conductors to ground includes grounded plate means in electrical contact with said one ends of the outer conductors of said sections, and a movable shorting bar disposed between and electrically contacting said outer conductors.

JOHN B. CARAWAY.

References Cited in the file of this patent

UNITED STATES PATENTS

| Number | Name | Date |
|---|---|---|
| 2,127,088 | Percival | Aug. 16, 1938 |
| 2,327,418 | Goldmann | Aug. 24, 1943 |
| 2,368,694 | Watts | Feb. 6, 1945 |
| 2,391,880 | Chesus | Jan. 1, 1946 |